United States Patent [19]

Jeuch

[11] Patent Number: 4,505,030

[45] Date of Patent: Mar. 19, 1985

[54] PROCESS FOR POSITIONING AN INTERCONNECTION LINE ON AN ELECTRICAL CONTACT HOLE OF AN INTEGRATED CIRCUIT

[75] Inventor: Pierre Jeuch, Seyssins, France

[73] Assignee: Commissariat a l'Energie Atomique, Seyssins, France

[21] Appl. No.: 483,959

[22] Filed: Apr. 12, 1983

[30] Foreign Application Priority Data

Apr. 14, 1982 [FR] France .................... 82 06409

[51] Int. Cl.³ .......................................... H01L 21/283
[52] U.S. Cl. ...................................... 29/591; 29/571;
   29/578; 148/1.5; 357/65; 156/661.1
[58] Field of Search .............. 29/571, 578, 580, 591;
   148/1.5; 156/654, 651, 661.1, 643, 644; 357/65

[56] References Cited

U.S. PATENT DOCUMENTS

| | | | |
|---|---|---|---|
| 3,518,751 | 7/1970 | Waters et al. | 29/591 |
| 3,692,574 | 9/1972 | Kobayashi | 156/661.1 X |
| 3,935,635 | 2/1976 | Botzenhardt | 29/591 X |
| 4,026,742 | 5/1977 | Fujino | 156/661.1 X |
| 4,160,683 | 7/1979 | Roche | 29/571 X |
| 4,185,294 | 1/1980 | Sumitomo et al. | 357/54 |
| 4,289,834 | 9/1981 | Alcorn et al. | 428/651 X |
| 4,295,924 | 10/1981 | Garnache et al. | 156/643 |
| 4,357,369 | 11/1982 | Kilichowski et al. | 156/644 X |
| 4,370,196 | 1/1983 | Vossen et al. | 156/643 |
| 4,403,392 | 9/1983 | Oshima et al. | 29/591 X |

FOREIGN PATENT DOCUMENTS

| | | |
|---|---|---|
| 2047799 | 5/1971 | Fed. Rep. of Germany . |
| 2730819 | 1/1979 | Fed. Rep. of Germany . |
| 2312190 | 11/1977 | France . |
| 2428915 | 11/1980 | France . |

Primary Examiner—Brian E. Hearn
Assistant Examiner—David A. Hey
Attorney, Agent, or Firm—Cesari and McKenna

[57] ABSTRACT

Process for the positioning of an interconnection line on an electrical contact hole of an integrated circuit, wherein, when the electrical contact hole has been produced, the following stages are performed:
 deposition of a conductive layer in which the interconnection line is to be formed on the complete integrated circuit;
 deposition on the conductive layer of an insulating layer blanking the relief thereof and having a planar surface,
 etching the insulating layer, so that insulating material is only left at the location of the electrical contact hole,
 deposition of a resin layer on the integrated circuit, so as to mask the interconnection line to be produced,
 etching of that part of the conductive layer which is free from resin and the residual insulating layer, and
 elimination of the remaining insulating layer and the resin layer.

The positioning process is particularly used in processes for producing MOS integrated circuits.

6 Claims, 7 Drawing Figures

PROCESS FOR POSITIONING AN INTERCONNECTION LINE ON AN ELECTRICAL CONTACT HOLE OF AN INTEGRATED CIRCUIT

BACKGROUND OF THE INVENTION

The present invention relates to a process for the positioning of an interconnection line on an electrical contact hole of an integrated circuit. This positioning process is more particularly usable in the production of MOS (metal-oxide-semiconductor) integrated circuits.

FIG. 1 is a sectional view illustrating the prior art procedure for positioning an interconnection line on an electrical contact hole of an integrated circuit. The integrated circuit 2 comprises a doped semiconducting, active zone 4, corresponding for example to the source or drain of a MOS transistor, which is to be electrically connected to another, not shown, active zone of the integrated circuit. This active zone 4 is covered by an oxide layer 6, in which is formed the electrical contact hole 8 of said active zone 4, by cutting the oxide layer by chemical etching through a suitable mask disposed on the layer. The interconnection of the active zone 4 and the other active zone of the integrated circuit is brought about by covering the complete integrated circuit with a conducting layer 10, then chemically etching the latter through an appropriate mask disposed on the conducting layer.

To prevent etching of the material (silicon) of the active zone 4 of integrated circuit 2 during the etching of the interconnection line in conducting layer 10, it is necessary for the latter to cover not only the electrical contact hole 8, but also a good part of the oxide layer 6, located on either side of said hole. Unfortunately, the fact that conductive layer 10 overlaps the contact hole 8, limits the integration density of this integrated circuit.

SUMMARY OF THE INVENTION

The present invention relates to a process for positioning an interconnection line on an electrical contact hole of an integrated circuit, which makes it possible to obviate this disadvantage. This positioning process more particularly makes it possible to increase the integration density of integrated circuits by more than 20% in certain cases, compared with the prior art positioning processes.

More specifically, the present invention relates to a process for the positioning of an interconnection line on an electrical contact hole of an integrated circuit, wherein, when the electrical contact hole has been produced, the following stages are performed:
- deposition of a conductive layer in which the interconnection line is to be formed on the complete integrated circuit,
- deposition on the conductive layer of an insulating layer blanking the relief thereof and having a planar surface,
- etching the insulating layer, so that insulating material is only left at the location of the electrical contact hole,
- deposition of a resin layer on the integrated circuit, so as to mask the interconnection line to be produced,
- etching of that part of the conductive layer which is free from resin and the residual insulating layer, and
- elimination of the remaining insulating layer and the resin layer.

This process makes it possible to obviate any useless overlap of the conductive layer beyond the electrical contact holes, thus making it possible to increase the integration of the integrated circuit.

According to a preferred embodiment of the process according to the invention, the insulating layer is a resin layer.

According to another preferred embodiment, following the deposition of the insulating layer, the latter undergoes heat treatment at a temperature such that the layer flows, so as to improve the flatness of its surface.

According to another advantageous embodiment, the etching of the insulating layer involves a dry etching process using an oxygen plasma.

BRIEF DESCRIPTION OF THE DRAWINGS

The invention is described in greater detail hereinafter relative to non-limitative embodiments and the attached drawings, wherein show.

DETAILED DESCRIPTION OF THE INVENTION

Figure 1:
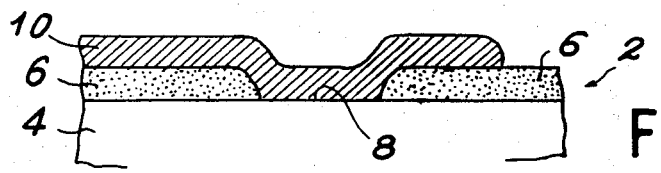
FIG. 1: already described, the positioning of an interconnection line at the electrical contact hole of an integrated circuit, in accordance with the prior art.
Figure 2:
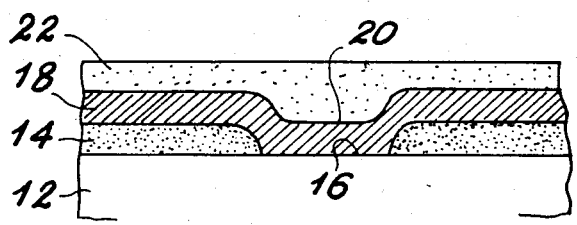
FIGS. 2 to 5: diagrammatically, the different stages of the positioning process according to the invention.

FIG. 2 shows part of an integrated circuit comprising a doped semiconducting, active zone 12, corresponding for example to the source or drain of an MOS transistor, which is to be electrically connected to another, not shown, active zone of the integrated circuit. Conventionally, active zone 12 is covered with a generally silica insulating layer 14, which can contain 5 to 10% of phosphorus. For example, this silica layer has a thickness of 0.8 micron. The silica layer 14 is then etched by using a resin mask, produced by photolithography thereon, e.g. by chemical etching, in order to produce the electrical contact hole 16 of active zone 12.

After producing the electrical contact hole 16, a preferably aluminium conductive layer 18 is deposited on the complete integrated circuit in per se known manner, e.g. by magnetron sputtering. This conductive layer 18 has a constant thickness of e.g. approximately 1 micron and its profile is dependent on the underlying layers. In particular, it has a cavity 20 at the electrical contact hole 16.

According to a preferred embodiment of the invention, an insulating layer is deposited in conventional manner on the complete conductive layer 18, in such a way that it has a planar surface. This insulating layer is preferably of resin, like those conventionally used in photolithography. In the case of a resin insulating layer, the latter can be deposited by centrifuging according to the method normally used for depositing photosensitive resins in photolithography operations (so-called whirler process). As a function of the viscosity of the resin used, there is advantageously a heat treatment, following the deposition of the resin at a temperature making it possible to obtain a maximum flat surface, due to the flow of resin layer 22.

For example, a photosensitive resin can be heated to a temperature of 150° C. to 200° C.

Figure 3:
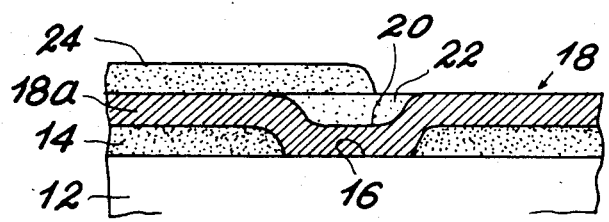

The following stage of the positioning process consists of etching the in particular resin insulating layer 22, so as to only leave insulating material at the location of the electrical contact hole 16, i.e. in the region of cavity 20 in conductive layer 18, as shown in FIG. 3. For example, etching can be carried out by a dry etching process using an oxygen plasma.

Following the etching of resin layer 22, a second photosensitive resin layer 24 is deposited by coating and in this is produced the image of the interconnections to be produced according to conventional photolithography processes, i.e. masking the interconnection line 18a.

Figure 4:
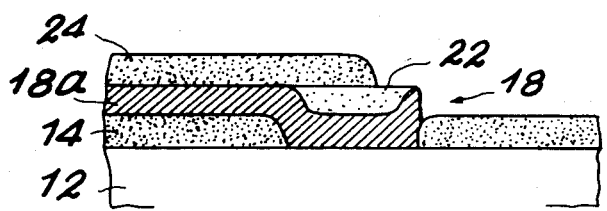

As shown in FIG. 4, the following stage of the positioning process consists of the etching of that part of the conductive layer 18, which is free from resin layer 24 and residues of resin layer 22, the resin layers 24 and 22 serving as a mask for the etching process. This process can be performed isotropically by chemical etching in a solution containing phosphoric acid in the case of an aluminium conductive layer 18. In the case of very small dimensions, preference is given to the use of an anisotropic etching process using a plasma formed e.g. from compounds such as $CCl_4$.

Figure 5:
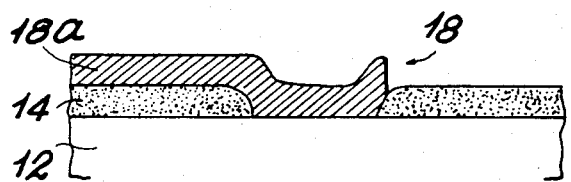

The final stage of the process consists of eliminating the residual resin layers 24 and 22, by using e.g. an oxygen plasma. The structure obtained is shown in FIG. 5.

The aforementioned positioning process makes it possible to only retain that region of the conductive layer 18 located in the electrical contact hole 16, the active zone 12 and the region 18a corresponding to the interconnection line for connecting active zone 12 to another active zone of the integrated circuit. Through reducing the conductive layer to a minimum, compared with prior art positioning processes, it is possible to obtain a significant increase in the integration density of the integrated circuit.

Figures 6, 7:
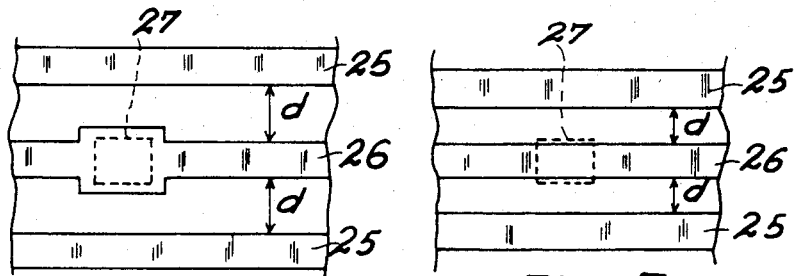
FIGS. 6 and 7: a typical arrangement of the mask defining the interconnection line, respectively according to the prior art and according to the invention.

This increase is illustrated by FIGS. 6 and 7 showing a typical arrangement of the mask defining the interconnection line compared with that defining a contact hole, according to the prior art in FIG. 6 and according to the invention in FIG. 7. The process described hereinbefore makes it possible to reduce the spacing d of interconnection lines 25 close to that of line 26, forming the connection of the electrical contact hole 27.

What is claimed is:

1. A process for making a self-positioning electrical connection to the active zone of an integrated circuit comprising the steps of
    A. depositing a circuit-insulating layer on the active zone of the integrated circuit;
    B. locally etching the circuit-insulating layer to form an electrical contact hole which exposes said zone;
    C. depositing a conductive layer from which the connection is to be formed on the integrated circuit which covers the circuit-insulating layer and the portion of the zone exposed in said hole;
    D. depositing an insulating layer on the conductive layer which blanks the relief thereof and has a planar surface;
    E. etching the insulating layer so that insulating material is left only at the location of the electrical contact hole;
    F. depositing a resin layer on the integrated circuit so as to mask the electrical connection to be produced;
    G. etching the part of the conductive layer which is free from resin and the residual insulating layer; and
    H. removing the remaining insulating layer and the resin layer to form an interconnection line on the electrical contact hole.

2. A process according to claim 1, wherein the insulating layer is a resin layer.

3. A process according to claim 1, wherein, following the deposition of the insulating layer, the latter undergoes heat treatment at a temperature enabling the latter to flow in order to improve the flatness of its surface.

4. A process according to claim 1, wherein a dry etching process using an oxygen plasma is used for etching the insulating layer.

5. A process according to claim 1, wherein isotropic chemical etching is used for etching the conductive layer.

6. A process according to claim 1, wherein an anisotropic etching process using a plasma is used for etching the conductive layer.

* * * * *